United States Patent [19]

Ichimura et al.

[11] Patent Number: 5,246,815
[45] Date of Patent: * Sep. 21, 1993

[54] PHOTOSENSITIVE MATERIAL FOR SCREEN PROCESSING

[75] Inventors: Kunihiro Ichimura, Ibaraki; Keiji Kubo, Hyogo, both of Japan

[73] Assignees: Gen. Director of the Agency of Industrial Science & Technology, Tokyo; Daicel Chemical Industries, Ltd., Osaka, both of Japan

[*] Notice: The portion of the term of this patent subsequent to Apr. 24, 2007 has been disclaimed.

[21] Appl. No.: 885,246

[22] Filed: May 20, 1992

Related U.S. Application Data

[63] Continuation of Ser. No. 298,790, Jan. 19, 1989, abandoned, which is a continuation of Ser. No. 30,834, Feb. 3, 1987, abandoned.

[30] Foreign Application Priority Data

Jul. 4, 1984 [JP] Japan ................................. 59-138782

[51] Int. Cl.$^5$ ............................................. G03C 1/492
[52] U.S. Cl. ................................... 430/270; 430/271; 430/308
[58] Field of Search .................... 430/270, 271, 308

[56] References Cited

U.S. PATENT DOCUMENTS

| | | | |
|---|---|---|---|
| 4,339,524 | 7/1982 | Ichimura et al. | 430/270 |
| 4,478,977 | 10/1984 | Sperry et al. | 430/270 |
| 4,564,580 | 1/1986 | Ichimura et al. | 430/270 |
| 4,920,030 | 4/1990 | Ichimura et al. | 430/270 |

FOREIGN PATENT DOCUMENTS

| | | |
|---|---|---|
| 0092901 | 11/1983 | European Pat. Off. |
| 58-139143 | 8/1983 | Japan |
| 59-102232 | 6/1984 | Japan |

*Primary Examiner*—Jack P. Brammer
*Attorney, Agent, or Firm*—Birch, Stewart, Kolasch & Birch

[57] ABSTRACT

A photosensitive material for screen processing comprising a photosensitive resin composition (A) applied to a plastic film, and including a water-soluble or water-dispersible polymer or copolymer, an unsaturated compound, and a photopolymerization initiator, and a photosensitive resin composition (B) applied in a thickness of at least 0.1 μm to the coated composition (A) and including a film-forming polymeric compound; and a photo-crosslinking polyvinyl alcohol partially containing photo-cross-linkable units provides a coating film which is water-developable, highly sensitive, and excellent in water and solvent resistances.

11 Claims, 1 Drawing Sheet

PHOTOSENSITIVE MATERIAL FOR SCREEN PROCESSING

This application is a continuation of application Ser. No. 07/298,790 filed on Jan. 19, 1989 now abandoned, which is a Rule 62 continuation application of Ser. No. 07/030,834 filed on Feb. 3, 1987 both abandoned, the entire contents of which are incorporated herein by reference.

FIELD OF INDUSTRIAL APPLICATION

The present invention relates to a photosensitive material for screen processing capable of forming a water-developable, highly sensitive coating film having excellent water and solvent resistance.

PRIOR ART AND PROBLEMS

Screen printing has various advantages such as easy printing operation, high image accuracy, freeness from strict limitation with respect to print base, large building-up of an applied ink, etc. Thus, it is employed in diverse fields, while it is expanding its scope of application in fields having a rapid increasing demand therefor.

The so-called direct process for producing a screen plate comprises applying a photosensitive emulsion prepared by mixing a photosensitive agent such as a dichromate or a diazo resin with polyvinyl alcohol and a polyvinyl acetate emulsion to a screen made of a polyester or a nylon and stuck on a frame to form a photosensitive coating film. In the direct process, however, the application step is not disadvantageous since it takes a long time, and provides a large variation of the thickness of the coating film and a lack of smoothness of the coating film surface entailing a reduced resolution, because of repetition of manual application work and drying.

As a result of investigations with a view to obviating the disadvantages of the above-mentioned conventional process comprising directly applying a photosensitive emulsion onto a surface of a screen to form a coating film, the inventor of the present invention soluble to overcome the problems of the prior art. Specifically, the present inventor found that a procedure comprising the preparation of a photosensitive material for screen processing by coating a plastic film with a photosensitive emulsion, placing the photosensitive material to the surface of a screen with the aid of the water of a photosensitive emulsion, and removal of the plastic film after drying can curtail the working steps and provide a uniform thickness of the coating film on the surface of a screen to materialize a screen printing plate with a very high accuracy. Based on this finding, the inventor disclosed an invention in Japanese Patent Laid-Open No. 85,048/1982.

However, the coating film obtained in accordance with the previous proposal involves a problem of water resistance which obstructs printing with a water ink, or the like. With a view to solving the problem, the inventor of the present invention previously found a photosensitive material comprising a plastic film, a photosensitive resin composition (I) comprising a water-soluble or water-dispersible polymer or copolymer, an unsaturated compound having a photopolymerizable ethylenic double bond, and a photoreaction initiator and applied to the plastic film, and a photosensitive resin composition (II) comprising polyvinyl alcohol, a polyvinyl acetate emulsion, and a diazo compound and applied to the composition (I). Based on this finding, the inventor disclosed an invention in Japanese Patent Laid-Open No. 139,143/1983.

Since the sensitivity of the photosensitive resin composition (II) is considerably lower than that of the photosensitive resin composition (I), however, the procedure must be adapted to the sensitivity of the photosensitive resin composition (II). Thus, the photosensitive material for screen processing of the above-mentioned invention is defectively low in sensitivity as a whole.

MEANS FOR SOLVING THE PROBLEMS

The inventor of the present invention has completed the present invention as a result of intensive investigations with a view to solving the above-mentioned problems.

An object of the present invention is to provide a photosensitive material for screen processing capable of forming a coating film which is water-soluble and highly sensitive, and which allows a water ink to be used. Another object of the present invention is to provide a photosensitive material for screen processing utilizable a PS plate.

The photosensitive material for screen processing of the present invention, which has attained the above-mentioned objects, comprises a photosensitive resin composition (A) applied to a plastic film, and including a water-soluble or water-dispersible polymer or copolymer, an unsaturated compound having a photopolymerizable ethylenic double bond, and a photopolymerization initiator, and a photosensitive resin composition (B) applied in a thickness of at least 0.1 μm to the coated composition (A) and including a film-forming polymeric compound; and a photo-crosslinkable polyvinyl alcohol partially containing photo-crosslinkable units of at least one member selected from the group consisting of kinds of units represented by general formulas (I), (IV) and (V):

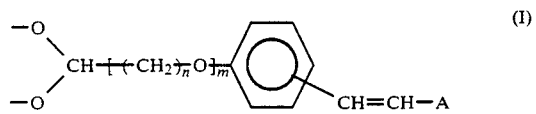
(I)

wherein A is a group selected from among groups represented by the general formula (II) or (III):

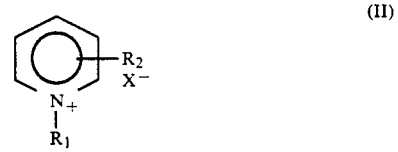
(II)

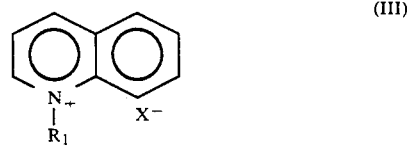
(III)

wherein $R_1$ is a hydrogen atom, an alkyl group or an aralkyl group which may contain a hydroxyl group, a carbamoyl group, an ether bond, or an unsaturated bond; $R_2$ is a hydrogen atom or a lower alkyl group; $X^-$ is an anion, m is an integer of 0 or 1, and n is an integer of 1 to 6; general formula (IV):

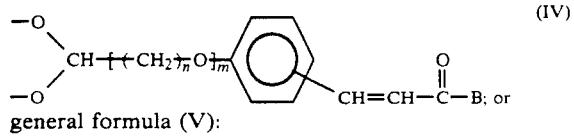

general formula (V):

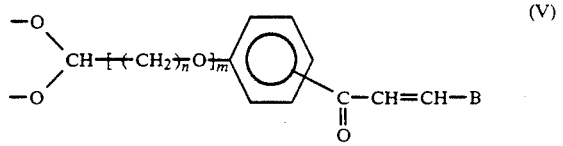

wherein B is an aromatic or heterocyclic group having at least one kind of polar group; and m and n are as defined in the general formula (I).

The water-soluble or water-dispersible polymer or copolymer to be used in the photosensitive resin composition (A) includes synthetic polymeric compounds such as polyethylene oxide, acrylic acid homopolymers and copolymers, acrylamide homopolymers and copolymers, maleic acid homopolymers and copolymers, vinyl acetate homopolymers and copolymers and their hydrolyzates, vinylpyrrolidone homopolymers and copolymers, vinylpyridine homopolymers and copolymers, and water-soluble polyamides; semi-synthetic polymeric compounds such as ethylcellulose, hydroxypropylcellulose, and carboxymethylcellulose; and natural polymeric compounds such as gelation and alginic acid.

The unsaturated compound having a photopolymerizable ethylenic double bond that is used in the present invention is preferably soluble in water and/or a liquid mixture of water and an organic solvent and preferably well compatible with a homopolymer or copolymer as mentioned above. Such compounds include vinyl monomers or vinyl prepolymers having 1 to 3 polymerizable ethylenic double bonds derived from among acryl, methacryl, allyl, vinyl ether, and acrylamide groups, etc.

Photopolymerization initiators usable in the present invention include anthraquinones, benzophenones, benzoins, benzils, diazonium compounds, and azide compounds.

The ratio of the polymer or copolymer: the unsaturated compound: photopolymerization initiator in the photosensitive resin composition (A) to be used in the present invention is preferably 30 to 90:70 to 10:0.01 to 10 in terms of parts by weight. Other arbitrary components such as a thermal polymerization inhibitor may be incorporated.

The film-forming polymeric compound to be used in the photosensitive resin composition (B) in the present invention may be used in the form of an emulsion containing the same in the present invention. Usable emulsions include those of vinyl acetate, acrylic, ethylene-vinyl acetate, ethylene-acrylic, vinyl chloride and vinylidene chloride, and an SBR latex.

The photo-crosslinkable polyvinyl alcohol to be used in the present invention is obtained by introducing the above-mentioned photo-crosslinkable units represented by the general formula (I), (IV), or (V) into a polyvinyl alcohol prepared by completely or partially saponifying a polyvinyl acetate. Introduction of the photo-crosslinkable units represented by the general formula (I), (IV), or (V) can be effected by a known method such as one disclosed in Japanese Patent Publication No. 5,761/1981 or 5,762/1981, or Japanese Patent Laid-Open No. 194,905/1983. The method of synthesis of the polyvinyl alcohol containing photo-crosslinkable units of the formula (I) will be described as the representative example. Specifically, polyvinyl alcohol is reacted in the presence of an acid catalyst with a stilbazolium or styrylquinolinium salt compound, respectively, represented by a general formula (VI) or (VII):

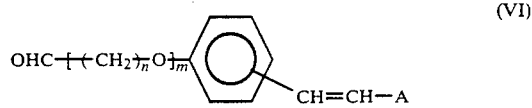

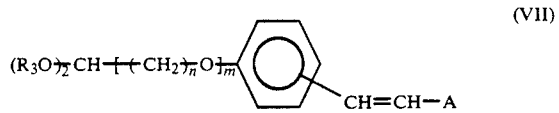

wherein A, m, and n are as defined above; and $R_3$ is a lower alkyl group, to two $R_3$ groups constitute an alkylene group, whereby a photo-crosslinkable polyvinyl alcohol having the stilbazolium or styrylquinolinium groups introduced thereinto is obtained.

Examples of the compound represented by the general formula (VI) include 1-methyl-2-(p-formylstyryl)-pyridinium, 1-methyl-4-(p-formylstyryl)pyridinium, 1-ethyl-2-(p-formylstyryl)pyridinium, 1-ethyl-4-(p-formylstyryl)pyridinium, 1-allyl-4-(p-formylstyryl)-pyridinium, 1-(2-hydroxyethyl)-2-(p-formylstyryl)-pyridinium, 1-(2-hydroxyethyl)-4-(p-formylstyryl)-pyridinium, 1-carbamoylmethyl-2-(p-formylstyryl)-pyridinium, 1-carbamoylmethyl-4-(p-formylstyryl)-pyridinium, 1-methyl-2-(m-formylstyryl)pyridinium, 1-benzyl-2-(p-formylstyryl)pyridinium, 1-benzyl-4-(p-formylstyryl)pyridinium, 1-methyl-4-(p-formylstyryl)-5-ethylpyridinium, 1-methyl-2-(p-formylstyryl)-quinolinium, 1-ethyl-2-(p-formylstyryl)quinolinium, and 1-ethyl-4-(p-formylstyryl)quinolinium.

The acetal compound of the formyl compound represented by the general formula (VI) may be used as the compound represented by the general formula (VII). Usable anions represented by $X^-$ include halogen, phosphate, sulfate, methosulfate, and p-toluenesulfonate ions.

Examples of the aromatic or heterocyclic group B having a polar group in the photo-crosslinkable unit represented by the general formula (IV) or (V) include those substituted with a carboxylic acid or its salt, a sulfonic acid or its salt, or a primary, secondary, tertiary amine or its salt including a quaternary salt of a tertiary amine.

Polyvinyl alcohol used in the preparation of the photo-crosslinkable polyvinyl alcohol preferably has a degree of saponification of 75 mol % or more and an average molecular weight of 300 to 3,000. The content of the photo-crosslinkable units in the alcohol is preferably 0.5 to 10 mol %. Too large a content increases the viscosity of the reaction product, thus making the preparation thereof difficult. Furthermore, the water solubility of the obtained photosensitive resin composition becomes insufficient.

The ratio of the film-forming polymeric compound to the photo-crosslinkable polyvinyl alcohol in the photosensitive resin composition (B) in the present invention is preferably in the range of 100 parts by weight: 10 to 200 parts by weight.

The photosensitive resin composition (B) for screen processing to be used in the present invention exhibits a high sensitivity even with a small amount of the photo-crosslinkable units, and is not affected by oxygen in air.

The thickness of the photosensitive resin composition (B) is determined according to the purpose. When the photosensitive resin composition (B) is used as the protective layer for the photosensitive resin composition (A), a thickness of the photosensitive resin composition (B) of at least 0.1 μm will suffice. In this case, however, the screen cannot be reproduced. Where reproduction is necessary, the thickness of the photosensitive resin composition (B) must be at least 10 μm.

Even if the photosensitive resin composition (B) is replaced by a non-photosensitive resin composition (B') such as a system of polyvinyl alcohol alone, the performance of the composition as a protective layer can be exhibited. However, the printing resistance is largely affected since the portion consisting of the photosensitive or non-photosensitive resin composition (B or B') corresponds to one bitten inward by a screen when the photosensitive material is applied to the screen. In other words, in the case of the non-photosensitive resin composition (B'), the printing resistance is insufficient, and a photosensitive material for screen processing capable of allowing a screen to be reproduced cannot be prepared.

A small amount of an adequate dye may be incorporated into the above-mentioned photosensitive resin compositions (A) and (B) in order to facilitate inspection of pinholes, etc. in an image formed by light exposure and development. In order to improve the various performance characteristics of the film, small amounts of a plasticizer, a surface-active agent, a lubricant, a fine powder, and various additives may be added.

Methods of obtaining the photosensitive material for screen processing of the present invention from the photosensitive resin compositions (A) and (B) include one comprising applying the photosensitive resin composition (A) to a film selected from among various plastic films such as polyethylene terephthalate, polypropylene, polycarbonate, polyvinyl chloride, and cellulose acetate films by an ordinary technique, and applying thereto the photosensitive resin composition (B) in one layer.

There is an alternative one comprising layer-wise casting and drying the compositions on a surface of a heated drum or a heated endless belt by an ordinary solution casting technique to prepare film sheets and sticking them to a plastic film as mentioned above to form a laminate.

As described above, since the photosensitive resin composition (B) is provided on the anaerobic photosensitive resin composition (A) without fail, neither cover film nor the like is needed, nor reduction of the sensitivity occurs, while there is a wide latitude of light exposure due to absence of any difference in the sensitivity between the photosensitive resin compositions (A) and (B), which are both highly sensitive.

EFFECTS OF THE INVENTION

The above-described photosensitive material for screen processing of the present invention can curtail the steps of the direct method and compensate for the defects of the indirect method. The obtained screen printing plate is developable with water and highly sensitive, and excellent in resolution, water resistance, solvent resistance, film strength, printing resistance, while the edge of a pattern formed is sharp. Thus, beautiful and precise prints can be obtained. The pattern used can be subjected to reproduction of a screen.

The photosensitive material for screen processing of the present invention may be applied to a screen, dried, and stored in the dark without causing peeling of the plastic film. In this case, the resulting material can be used as a presensitized plate.

EXPLANATION OF SYMBOLS 1. plastic film
2. photosensitive resin composition (A)
3. photosensitive resin composition (B)
4. photosensitive material for screen processing
5. screen plate
6. squeegee
7. applied photosensitive layer

EXAMPLES

Examples of the method of using the photosensitive material for screen processing of the present invention will be described with reference to the drawings.

Figure 1:
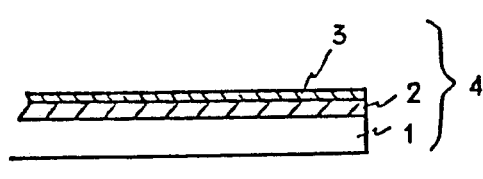
FIGS. 1, 2, and 3 are illustrative views showing the steps of production for a screen printing plate from the photosensitive material for screen processing of the present invention by the direct method.

(a) According to the direct method FIG. 1 shows a photosensitive material (4) for screen processing formed by application of the photosensitive resin compositions (A)(2) and (B)(3) in uniform thicknesses to a plastic film (1) and drying the same. The photosensitive material (4) was cut into an adequate size, wetted with water, and contact-bonded to a preliminarily prepared screen plate (5) with a squeegee (6) as shown in FIG. 2.

Figure 2:
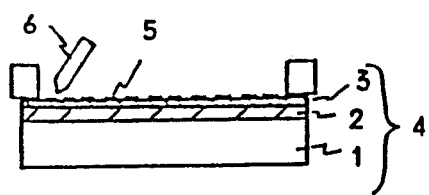
Figure 3:
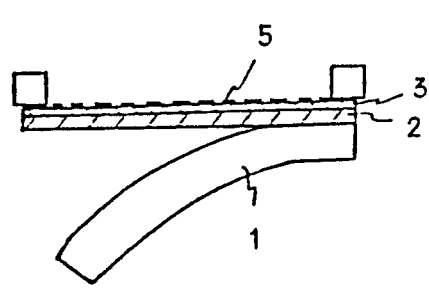

Alternatively, the photosensitive material (4) was superposed on a screen plate (5), the plate (5) was uniformly wetted on its surface by water with a sponge, a spray, or the like, followed by contact-bonding by squeezing with a squeegee (6) as shown in FIG. 2. The obtained screen plate was well dried by cool air or warm air of 50° C. or lower. Thereafter, the plastic film (1) was stripped as shown in FIG. 3 to form a screen printing plate.

Figure 4:
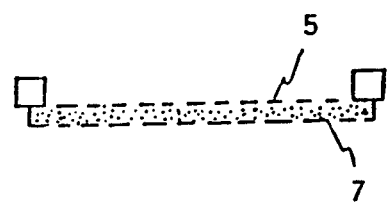
FIGS. 4 and 5 are illustrative views showing the steps of production of a screen printing plate in the same way but by the indirect method.
Figure 5:
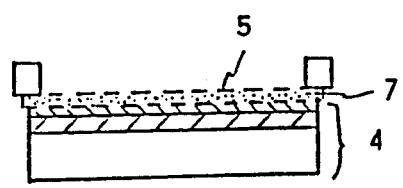

(b) According to the indirect method, a photosensitive emulsion composed of a film-forming polymeric compound and a photo-crosslinkable polyvinyl alcohol as used in the photosensitive resin composition (B) or other photosensitive emulsion for screen processing was applied to a screen plate (5) with a squeegee bat in the same manner as in the direct method to form a photosensitive layer (7) as shown in FIG. 4. Subsequently, a photosensitive material (4) for screen processing was contact-bonded onto a non-dried photosensitive layer (7) with a squeegee (6) in the same manner as in (a) above, as shown in FIG. 5. The subsequent steps are the same as in (a) above.

The following Examples will illustrate the present invention in more detail.

REFERENTIAL EXAMPLE 1

110 g of N-methyl-γ-picolinium methosulfate and 200 g of terephthalaldehyde were dissolved in 400 ml of methanol while heating, and admixed with 6 ml of piperizine, followed by reflux for 3 hours. After cooling, ethanol was distilled off under reduced pressure, and washing was effected with ethyl acetate. The precipitate obtained was dissolved in hot ethanol, and slowly admixed with ethyl acetate to precipitate crystals, which were then washed with ethyl acetate and dried to obtain 120 g of N-methyl-γ-(p-formylstyryl)-pyridinium methosulfate.

REFERENTIAL EXAMPLE 2 (preparation of photo-crosslinkable polyvinyl alcohol (i))

9 g of N-methyl-γ-(p-formylstyryl)pyridinium methosulfate obtained in Referential Example 1 and 100 g of polyvinyl alcohol having a degree of saponification of 88 mol % and a degree of polymerization of 1,700 were dissolved in 900 ml of water while heating. 5 g of 85% phosphoric acid was added to the resulting solution, and the resulting mixture was heated at 60° C. for 5 hours with stirring, followed by stirring at ordinary temperature for one day. The reaction mixture was poured into a large amount of acetone to precipitate a resin, which was sufficiently washed with methanol twice, and dried to obtain 98 g of the washed resin. The stilbazolium group content of the total polymer units of polyvinyl alcohol was about 1.2 mol %.

REFERENTIAL EXAMPLE 3 (preparation of photo-crosslinkable polyvinyl alcohol (ii))

30 g of N-methyl-γ-(p-formylstyryl)pyridinium methosulfate was reacted with 100 g of polyvinyl alcohol having a degree of saponification 88% and a degree of polymerization of 500 in the same manner as in Referential Example 3 to obtain 105 g of a resin. The stilbazolium group content of the resin was about 3.5 mol %.

EXAMPLE 1

Photosensitive resin composition dispersions (A-1) and (B-2) having the following compositions were prepared.

| Photosensitive Resin Composition Dispersion (A-1): | |
|---|---|
| partially saponified polyvinyl alcohol (average degree of polymerization: 500, degree of saponification: 80 mol %) | 10 parts by weight |
| benzoin isopropyl ether | 0.25 part by weight |
| trimethylolpropane teimethacrylate | 0.8 part by weight |
| β-hydroxyethyl methacrylate | 10 parts by weight |
| water | 80 parts by weight |

| Photosensitive Resin Composition Dispersion (B-1): | |
|---|---|
| photo-crosslinkable polyvinyl alcohol (i) (obtained in Referential Example 2) | 10 parts by weight |
| polyvinyl acetate emulsion (solids concentration: 50 wt. %) | 20 parts by weight |
| water | 70 parts by weight |

The photosensitive resin composition dispersion (A-1) was applied to a surface of a biaxially stretched polyester film having a thickness of 75 μm by means of a bar coater, and dried with hot air of 60° C. to form a photosensitive coating film having a thickness of 30 μm. The photosensitive resin composition dispersion (B-1) was then applied thereto and dried to form a coating film having a thickness of 1 μm. Thus, a photosensitive material for screen processing was obtained.

The photosensitive material was stuck to a 150-mesh polyester screen stretched in a wooden frame by the method (a) (direct method), and dried by draft. When the polyester film was stripped, the photosensitive layer was bitten by the screen up to about 10 μm.

Subsequently, the screen was closely contacted with a positive original, exposed to light at a distance of 1 m from a 3 kW ultra-high pressure mercury lamp for 30 sec, washed with a water shower of ordinary temperature to effect development, and dried to obtain a screen printing plate having an excellent edge sharpness and including fine lines reproduced up to a line width of 100 μm. Printing was carried out using the screen printing plate to obtain over 10,000 prints which were very sharp and had a good image reproducibility.

EXAMPLE 2

The photosensitive resin composition dispersion (A-1) was applied to a biaxially stretched polyester film to form a photosensitive coating film having a thickness of 20 μm. The photosenstive resin composition dispersion (B-1) was then applied thereto and dried to form a coating film having a thickness of 20 μm. Thus, a photosensitive material for screen processing was obtained.

The obtained photosensitive film for screen processing was stuck to a 250-mesh polyester screen stretched in a wooden frame with the aid of water and dried by draft, followed by stripping of the polyester film.

The photosensitive layer was bitten up to about 25 μm.

Subsequently, the screen plate was closely contacted with a positive original, exposed to light at a distance of 1 m from a 3 kW ultra-high pressure mercury lamp for 40 sec, washed with a water shower of ordinary temperature to effect development, and dried to obtain a pinhole-free screen printing plate having an excellent edge sharpness and including fine lines reproduced up to a line width of 100 μm. After printing, the plate was treated with a commercially available film stripping solution which is used as an emulsion for the direct method. The film was perfectly stripped to reproduce a screen.

EXAMPLE 3

A dispersion (A-2) having the following composition was prepared instead of the photosensitive resin composition dispersion (A-1), from which a coating film having a thickness of 20 μm was formed on a biaxially stretched polyester film in the same manner as in Example 1.

| Photosensitive Resin Composition Dispersion (A-2): | |
|---|---|
| hydroxypropylcellulose (MS (molar number of substitution) of hydroxypropyl group: 3, viscosity of a 2.2% aqueous solution: 7 cP (20° C.)) | 20 parts by weight |
| triethylene glycol diacrylate | 4 parts by weight |
| diethylene glycol diacrylate | 4 parts by weight |
| benzoin methyl ether | 0.4 part by weight |
| methylene chloride/methanol: | 1/100 (parts by weight) |

The photosensitive resin composition dispersion (B-1) was applied thereto in a thickness of 0.5 μm, and dried to form a photosensitive material. The photosensitive resin composition dispersion (B-1) so adjusted to have a solids concentration of 30 wt. % was applied once by means of a squeegee bat on a 300-mesh polyester screen, on which the above-mentioned photosensitive material was superposed, followed by contact bonding by means of a squeegee. When drying was effected by draft and the polyester film was stripped, the photosensitive layer was bitten up to about 10 μm. Subsequently, the film of the photosensitive layer was closely contacted with a positive original, exposed to light at a distance of 1 m from a 4 kW ultra-high pressure mercury lamp for 20 sec, immersed in water at ordinary-temperature to dissolve out most of the unexposed portion, and ejected with water by means of a spray gun for the purpose of completely removing the unexposed portion to effect development, and dried with warm air of 45° C. to prepare a screen printing plate, which had an excellent edge sharpness and included fine lines reproduced up to a line width of about 60 μm. The screen was reproduced with a film stripping solution in the same manner as in Example 2.

EXAMPLE 4

A photosensitive material was obtained in the same manner as in Example 1 except that the photosensitive resin composition dispersion (B-2) was used instead of the photosensitive resin composition dispersion (B-1).

| Photosensitive Resin Composition Dispersion (B-2) | |
| --- | --- |
| photo-crosslinkable polyvinyl alcohol (ii) (obtained in Referential Example 3) | 10 parts by weight |
| polyvinyl acetate emulsion (solids concentration: 50 wt. %) | 30 parts by weight |
| water | 85 parts by weight |

Exposure to light and development were carried out in the same manner as in Example 1 to obtain a screen printing plate having a high-fidelty image.

What is claimed is:

1. A photosensitive element for screen processing which comprises:
   a plastic film,
   a first photosensitive layer disposed on said plastic film wherein the first photosensitive layer contains photosensitive resin composition (A), and
   a second photosensitive layer disposed on said first photosensitive layer wherein the second photosensitive layer is at least 0.1 μm thick and contains photosensitive composition (B),
   wherein said photosensitive resin composition (A) consists essentially of:
   A(i) a water soluble or water dispersible polymer or copolymer, which is selected from the group consisting of polyethylene oxide, acrylic acid homopolymers and copolymers, acrylamide homopolymers and copolymers, maleic acid homopolymers and copolymers, vinyl acetate homopolymers and copolymers and their hydrolyzates, vinylpyrrolidone homopolymers and copolymers, vinylpyridine homopolymers and copolymers, water-soluble polyamides, ethylcellulose, hydroxypropylcellulose, carboxymethylcellulose, gelatin and alginic acid;
   A(ii) an unsaturated compound having a photopolymerizable ethylenic double bond selected from the group consisting of acryl, methacryl, allyl, vinyl ether and acrylamide groups; and
   A(iii) a photopolymerization initiator,
   wherein the ratio of the polymer of copolymer A(I): the unsaturated compound A(ii): the photopolymerization initiator A(iii) in the photosensitive resin composition (A) is 30 to 90:70 to 10:0.01 to 10 parts by weight; and
   wherein said photosensitive resin composition (B) consists essentially of:
   B(i) a film-forming polymeric compound, and
   B(ii) a photo-crosslinkable polyvinyl alcohol having a degree of saponification of 75 mol % or more and an average molecular weight of 300 to 3000 and containing at least one photo-crosslinkable constituent unit present in an amount of 0.5 to 10 molar % based on said photo-crosslinkable polyvinyl alcohol and selected from the group consisting of:
   (a) formula (I):

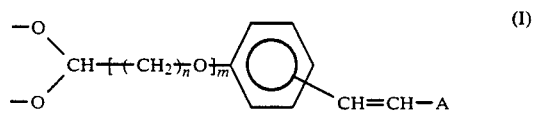

wherein A is represented by formulas (II) or (III):

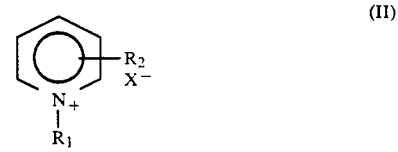

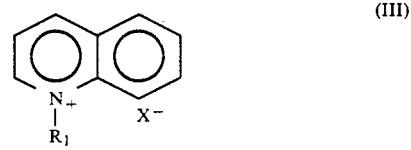

wherein $R_1$ represents a hydrogen atom, an alkyl group or an aralkyl group which may contain a hydroxyl group, a carbamoyl group, an ether bond, or an unsaturated bond, $R_2$ represents a hydrogen atom or a lower alkyl group, $X^-$ represents an anion, m represents an integer of 0 or 1, and n represents an integer of 1 to 6;

(b) formula (IV):

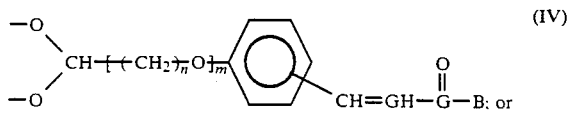

(c) formula (V):

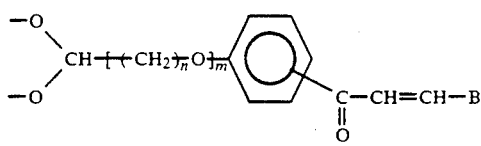

wherein B represents an aromatic group or a heterocyclic group having at least one polar group, and m and n are as defined above; and wherein the ratio of the film-forming polymeric compound B(i) to the photo-crosslinkable polyvinyl alcohol B(ii) in the photosensitive resin composition (B) is in the range of 100 parts by weight: 10 to 200 parts by weight.

2. The photosensitive element according to claim 1, wherein the water soluble or water dispersible polymer or copolymer is selected from the group consisting of synthetic polymeric compounds, semi-synthetic polymeric compounds and natural polymeric compounds.

3. The photosensitive element according to claim 2, wherein the synthetic polymeric compounds are selected from the group consisting of polyethylene oxide, acrylic acid homopolymers and copolymers, acrylamide homopolymers and copolymers, maleic acid homopolymers and copolymers, vinyl acetate homopolymers and copolymers and their hydrolyzates, vinylpyrrolidone homopolymers and copolymers, vinylpyridine homopolymers and copolymers, and water soluble polyamides.

4. The photosensitive element according to claim 2, wherein the semi-synthetic polymeric compounds are selected from the group consisting of ethylcellulose, hydroxypropylcellulose, and carboxymethylcellulose.

5. The photosensitive element according to claim 2, wherein the natural polymeric compounds are selected from the group consisting of gelatin and alginic acid.

6. The photosensitive element according to claim 5, wherein the unsaturated compound having a photopolymerizable ethylenic double bond is soluble in water and/or a liquid mixture of water and an organic solvent.

7. The photosensitive element according to claim 1, wherein the unsaturated compound having a photopolymerizable double bond is selected from the group consisting of vinyl monomers and vinyl prepolymers having 1 to 3 polymerizable ethylenic double bonds derived from among acryl, methacryl, allyl, vinyl ether, and acrylamide groups.

8. The photosensitive element according to claim 1, wherein the photopolymerizable initiator is selected from the group consisting of anthraquinones, benzophenones, benzoins, benzils, diazonium compounds, and azide compounds.

9. The photosensitive element according to claim 1, wherein anion $X^-$ is selected from the group consisting of halogen, phosphate, sulfate, methosulfate, and p-toluenesulfonate ions.

10. The photosensitive element according to claim 1, wherein the aromatic or heterocyclic group B having a polar group in the photo-crosslinkable unit represented by the general formula (IV) or (V) is substituted with a carboxylic acid or its salt, a sulfonic acid or its salt, or a primary, secondary, tertiary amine or its salt.

11. The photosensitive element according to claim 1, wherein the plastic film is selected from the group consisting of polyethylene terephthalate, polypropylene, polycarbonate, polyvinyl chloride, and cellulose acetate.

* * * * *